United States Patent
Higuchi et al.

(10) Patent No.: US 8,837,225 B2
(45) Date of Patent: Sep. 16, 2014

(54) NONVOLATILE SEMICONDUCTOR MEMORY DEVICE AND OPERATION METHOD OF THE SAME

(71) Applicant: Kabushiki Kaisha Toshiba, Tokyo (JP)

(72) Inventors: Masaaki Higuchi, Mie (JP); Katsuyuki Sekine, Mie (JP); Ryota Katsumata, Mie (JP); Hiroaki Hazama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 13/787,294

(22) Filed: Mar. 6, 2013

(65) Prior Publication Data

US 2014/0010016 A1    Jan. 9, 2014

(30) Foreign Application Priority Data

Jul. 3, 2012 (JP) ................. 2012-150023

(51) Int. Cl.
| | | |
|---|---|---|
| *G11C 16/04* | (2006.01) | |
| *G11C 16/02* | (2006.01) | |
| *H01L 29/788* | (2006.01) | |
| *H01L 29/792* | (2006.01) | |
| *G11C 16/34* | (2006.01) | |
| *G11C 5/02* | (2006.01) | |
| *G11C 5/06* | (2006.01) | |
| *H01L 27/105* | (2006.01) | |
| *H01L 27/115* | (2006.01) | |
| *G11C 16/14* | (2006.01) | |

(52) U.S. Cl.
CPC .......... *H01L 29/792* (2013.01); *H01L 27/1052* (2013.01); *G11C 16/0466* (2013.01); *G11C 16/0483* (2013.01); *G11C 5/063* (2013.01); *G11C 16/3436* (2013.01); *G11C 16/0408* (2013.01); *G11C 16/14* (2013.01); *H01L 27/1157* (2013.01); *H01L 27/11582* (2013.01); *H01L 29/7926* (2013.01)
USPC ............ 365/185.18; 365/185.17; 365/185.29; 365/51; 365/63

(58) Field of Classification Search
CPC .... G11C 16/0483; G11C 16/14; G11C 5/063; G11C 16/3436; G11C 2213/71; G11C 13/0097; H01L 2224/73265; H01L 2225/06541; H01L 2224/73215
USPC ............................ 365/185.17, 185.29, 51, 63
See application file for complete search history.

(56) References Cited

U.S. PATENT DOCUMENTS

| | | |
|---|---|---|
| 2010/0097858 A1 | 4/2010 | Tokiwa et al. |
| 2010/0123180 A1 | 5/2010 | Takano et al. |
| 2010/0207195 A1 | 8/2010 | Fukuzumi et al. |
| 2010/0237402 A1 | 9/2010 | Sekine et al. |
| 2010/0238732 A1 | 9/2010 | Hishida et al. |

FOREIGN PATENT DOCUMENTS

JP    2010102755 A    7/2012

*Primary Examiner* — Ly D Pham
(74) *Attorney, Agent, or Firm* — Patterson & Sheridan LLP

(57) ABSTRACT

A nonvolatile semiconductor memory device includes a semiconductor substrate and memory transistors, each of which has a laminate formed by alternately laminating insulating films and conductive films on the semiconductor substrate, a silicon pillar going through the laminate, a tunnel insulating film arranged on the surface of the silicon pillar facing the laminate, a charge accumulating layer arranged on the surface of the tunnel insulating film facing the laminate, and a block insulating film arranged on the surface of the charge accumulating layer facing the laminate and in contact with the conductive film. During a data deletion operation, a voltage is applied on the conductive film so that the potential of the silicon pillar with respect to the conductive film decreases as the cross-sectional area of the silicon pillar decreases.

19 Claims, 3 Drawing Sheets

NONVOLATILE SEMICONDUCTOR MEMORY DEVICE AND OPERATION METHOD OF THE SAME

CROSS-REFERENCE TO RELATED APPLICATION

This application is based upon and claims the benefit of priority from Japanese Patent Application No. 2012-150023, filed Jul. 3, 2012; the entire contents of which are incorporated herein by reference.

FIELD

Embodiments described herein relate generally to a nonvolatile semiconductor memory device and a method of operating the nonvolatile semiconductor memory device.

BACKGROUND

In recent years, extensive studies have been performed on development of a nonvolatile semiconductor memory device with a BiCS (Bit Cost Scalable) structure for increasing the capacity and cutting the cost by adopting a three-dimensional structure. The nonvolatile semiconductor memory device with the BiCS structure is prepared by processing of a laminate structure having a conductive word line layer and inter-word line insulating film, so that it is possible to minimize the cost on a per bit basis while increasing the number of layers in the laminate structure.

However, when the laminate structure is etched, the perpendicularity of the etching degrades, so that the hole cross-sectional area may be different at different depths of the laminate structure. As a result, the size of the cross-sectional area of silicon pillars arranged in the laminate may vary, and the threshold voltage of the memory cells may vary corresponding to the height of the laminate. Consequently, when deletion is performed for a block of memory cells on the various layers at a constant voltage, an over-deletion state occurs in some of the memory cells, leading to degradation in the reliability of the nonvolatile semiconductor memory device.

DETAILED DESCRIPTION

Embodiments provide a nonvolatile semiconductor memory device, and its operation method, that provides a reliable deletion operation that protects against an over-deletion state of the memory cells, which improves the reliability of the nonvolatile semiconductor memory device.

In general, according to one embodiment, the present disclosure will be explained with reference to the drawings.

The nonvolatile semiconductor memory device according to an embodiment has a semiconductor substrate and memory transistors, each of which has a laminate formed by alternately laminating inter-word line insulating films and word line conductive films on the semiconductor substrate, a silicon pillar going through the laminate, a tunnel insulating film arranged on the surface of the silicon pillar facing the laminate, a charge accumulating layer arranged on the surface of the tunnel insulating film facing the laminate, and a block insulating film arranged on the surface of the charge accumulating layer facing the laminate and in contact with the word line conductive film. During a data deletion operation for the memory transistors, a voltage is applied to the word line conductive film so that the potential of the silicon pillar with respect to the word line conductive film decreases as the cross-sectional area of the silicon pillar decreases.

(First Embodiment)

The constitution of the nonvolatile semiconductor memory device according to a first embodiment is explained with reference to FIG. 1 to FIG. 3.

Figure 1:
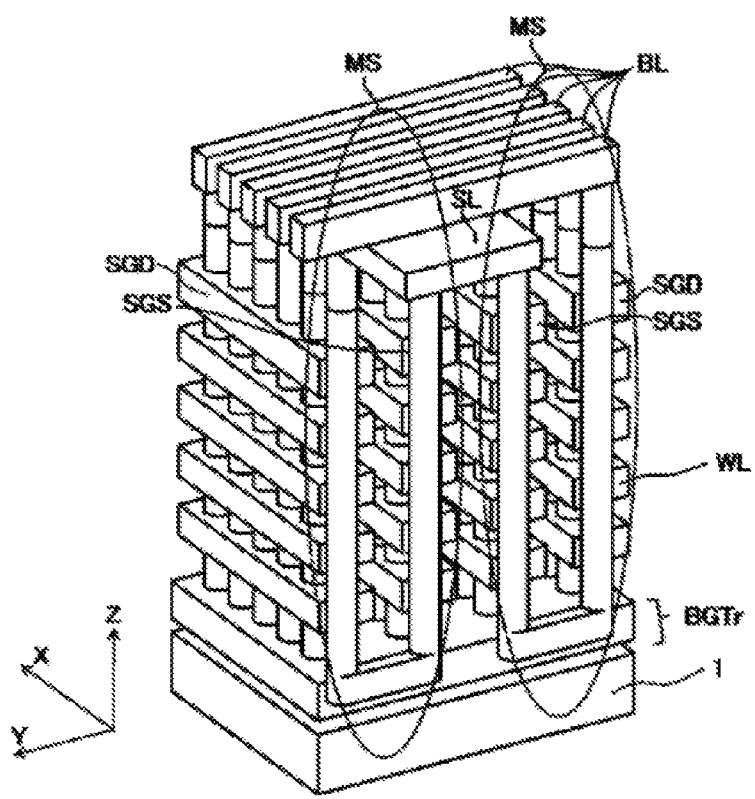
FIG. 1 is a perspective view illustrating a nonvolatile semiconductor memory device according to first and second embodiments.

FIG. 1 is a perspective view illustrating a nonvolatile semiconductor memory device according to the first embodiment. Insulating films, which are described in FIG. 2, are not shown in FIG. 1 to more clearly show the structure of the nonvolatile semiconductor memory device. FIG. 2 is a cross-sectional view illustrating the nonvolatile semiconductor memory device according to the first embodiment. In the following, in order to facilitate explanation, an XYZ Cartesian coordinate system is introduced in FIG. 1 and FIG. 2, and it will be explained below. As shown in FIG. 2, the X-direction is the direction going into the paper surface, the Y-direction is the direction from the right hand side to the left hand side across the paper surface, and the Z-direction is the upward direction. The nonvolatile semiconductor memory device according to the first embodiment has an impurity diffusion layer arranged as the back gate BG in an upper layer portion of a semiconductor substrate 1.

The nonvolatile semiconductor memory device according to the first embodiment has a back gate selection transistor (BGTr) driver (corresponding to reference numerals 2 and 3 in FIG. 2), a memory transistor (MTr) region (corresponding to reference numeral 6 in FIG. 2), a word line (WL) driver, a source-side select gate line (SGS) (corresponding to reference numeral 13 in FIG. 2) driver, a drain-side select gate line (SGD) (corresponding to reference numeral 13 in FIG. 2) driver, and a source line (SL) driver.

The word line WL structure comprises a layered sheet structure in a memory cell block. Multiple bit lines BL are formed in the X-direction, with the Y-direction shown in FIG. 1 as their longitudinal direction. Also, the drain-side select gate line SGD and the source-side select gate line SGS are formed in the direction nearly perpendicular to the bit lines BL, that is, with the X-direction as their longitudinal direction. Similarly, the source line SL is also formed in the X-direction nearly perpendicular to the bit lines BL, the X-direction being the longitudinal direction.

Figure 2:
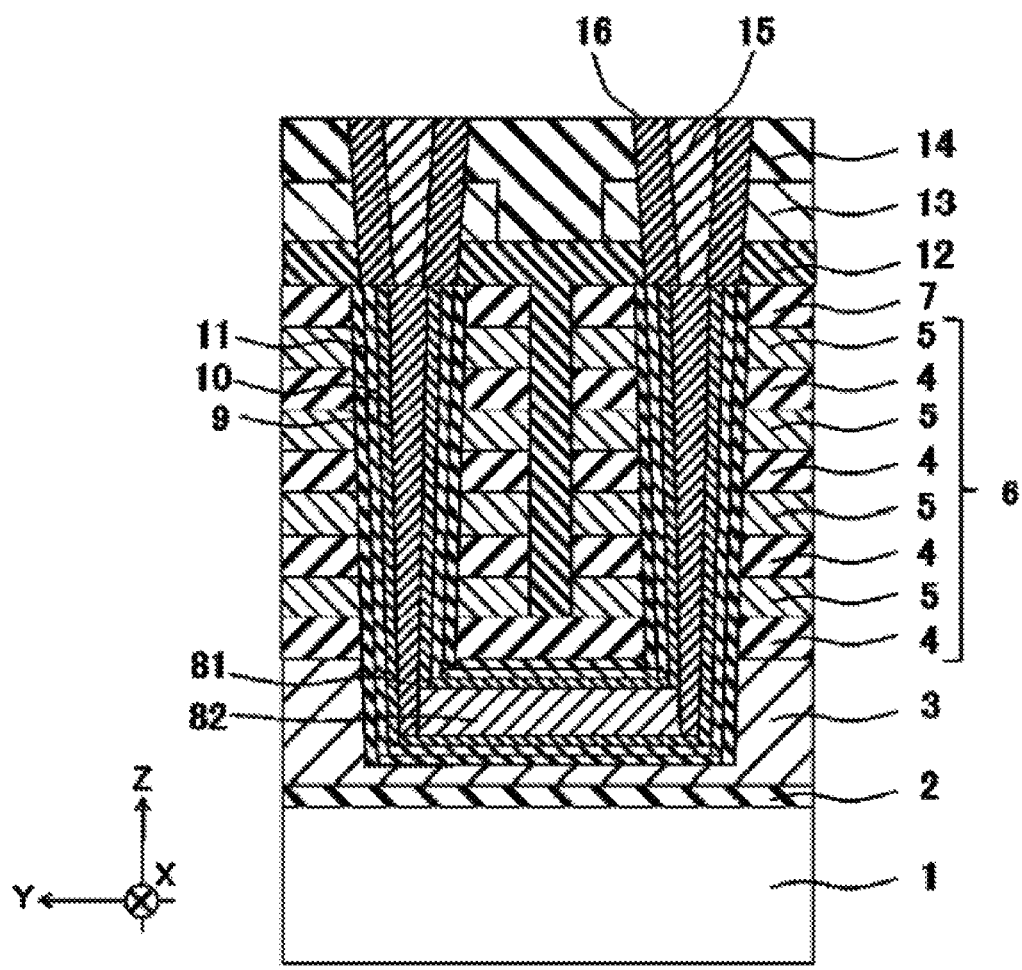
FIG. 2 is a cross-sectional view illustrating the nonvolatile semiconductor memory device according to the first and the second embodiments.

The word line driver controls the voltage applied on the word lines WL (indicated by reference numeral 5 in FIG. 2). The source-side select gate line (SGS) driver controls the voltage applied on the source-side select gate line SGS (indicated by reference numeral 13 in FIG. 2). The drain-side select gate line (SGD) driver controls the voltage applied on the drain-side select gate line (SGD) (indicated by reference numeral 13 in FIG. 2). A source line driver controls the voltage applied on the source line SL.

In the nonvolatile semiconductor memory device according to the first embodiment, the following transistors are arranged sequentially from the lower layer to the upper layer: the back gate selection transistor BGTr, the memory transistor MTr, as well as a drain-side select transistor SDTr and a source-side select transistor SSTr.

As shown in FIG. 2, on the semiconductor substrate 1, a back gate insulating film 2 and a back gate conductive film 3 are arranged as the back gate selection transistor BGTr (shown in FIG. 1). The back gate insulating film 2 is made of, for example, a silicon oxide film, and the back gate conductive film 3 is made of, for example, polysilicon.

On the back gate selection transistor BGTr (shown in FIGS. 1 and 3), a memory transistor MTr (shown in FIG. 3) having a laminate (layered) structure 6 is arranged. The memory transistor MTr has inter-word line insulating films 4 and word line conductive films 5 alternately laminated on the back gate conductive film 3. The inter-word line insulating film 4 is made of, for example, silicon oxide. The word line conductive film 5 is made of, for example, polysilicon. The inter-word line insulating films 4 are the word lines of the memory cells to be explained later, and they are called WL1, WL2, . . . WLn counted from the bottom layer in the present specification. The inter-word line insulating film 4 has a function of insulating between the layers of the word line conductive films 5. The word line conductive film 5 is connected to the word line driver that controls application of voltage on the word line conductive film 5. On the top of the inter-word line insulating film, an interlayer insulating film 7 is arranged. The interlayer insulating film 7 is made of, for example, a silicon oxide film.

The memory transistor MTr has a through hole (trench) formed through the interlayer insulating film 7, the inter-word line insulating films 4 and the word line conductive films 5. In the through hole, a silicon pillar 81 working as a channel is arranged. The silicon pillar 81 is made of, for example, polysilicon. The silicon pillars 81 are arranged in the XY surface in a matrix configuration with a certain spacing between them. For example, the through holes and the silicon pillars 81 are formed in a tapered shape such that the cross-sectional dimensions thereof, on a plane almost perpendicular to the through hole direction, become smaller as the through hole approaches the semiconductor substrate 1.

In the back gate conductive film 3, a silicon connection part 82 is arranged to connect the lower end portions of the pair of the silicon pillars 81 adjacent each other in the bit line BL direction. The silicon connection part 82 is made of, for example, polysilicon. The adjacent pair of the silicon pillars 81 and the silicon connection part 82 connecting the lower end portions thereof are connected to each other, and a U-shaped memory string MS (shown in FIG. 1) connected in tandem is formed.

A tunnel insulating film 9 is arranged on the surface of the silicon pillar 81 facing the word line conductive film 5. The tunnel insulating film 9 is made of, for example, a silicon oxide film.

A charge accumulating layer 10 is arranged on the surface of the tunnel insulating film 9 facing the word line conductive film 5. The charge accumulating layer 10 is made of, for example, a silicon nitride film. Also, the charge accumulating layer 10 is formed only at the position between the word line conductive film 5 and the silicon pillar 81, and it is not formed at the position between the inter-word line insulating film 4 and the silicon pillar 81.

On the surface of the charge accumulating layer 10 facing the word line conductive film 5, a block insulating film 11 is formed in contact with the word line conductive film 5 and the inter-word line insulating film 4. The block insulating film 11 is made of, for example, a silicon oxide film.

In the nonvolatile semiconductor memory device according to the present embodiment, the through hole containing the silicon pillar 81 has a tapered cone shape with the cross-sectional area on the plane nearly perpendicular to the through hole direction decreasing as the through hole approaches the semiconductor substrate 1, and the film thickness of the laminated film including the tunnel insulating film 9, the charge accumulating layer 10 and the block insulating film 11, becomes larger as the laminated film approaches the semiconductor substrate 1.

The laminated film corresponding to the tunnel insulating film 9, the charge accumulating layer 10 and the block insulating film 11 is arranged to not only surround the silicon pillar 81, but also the silicon connection part 82.

Figure 3:
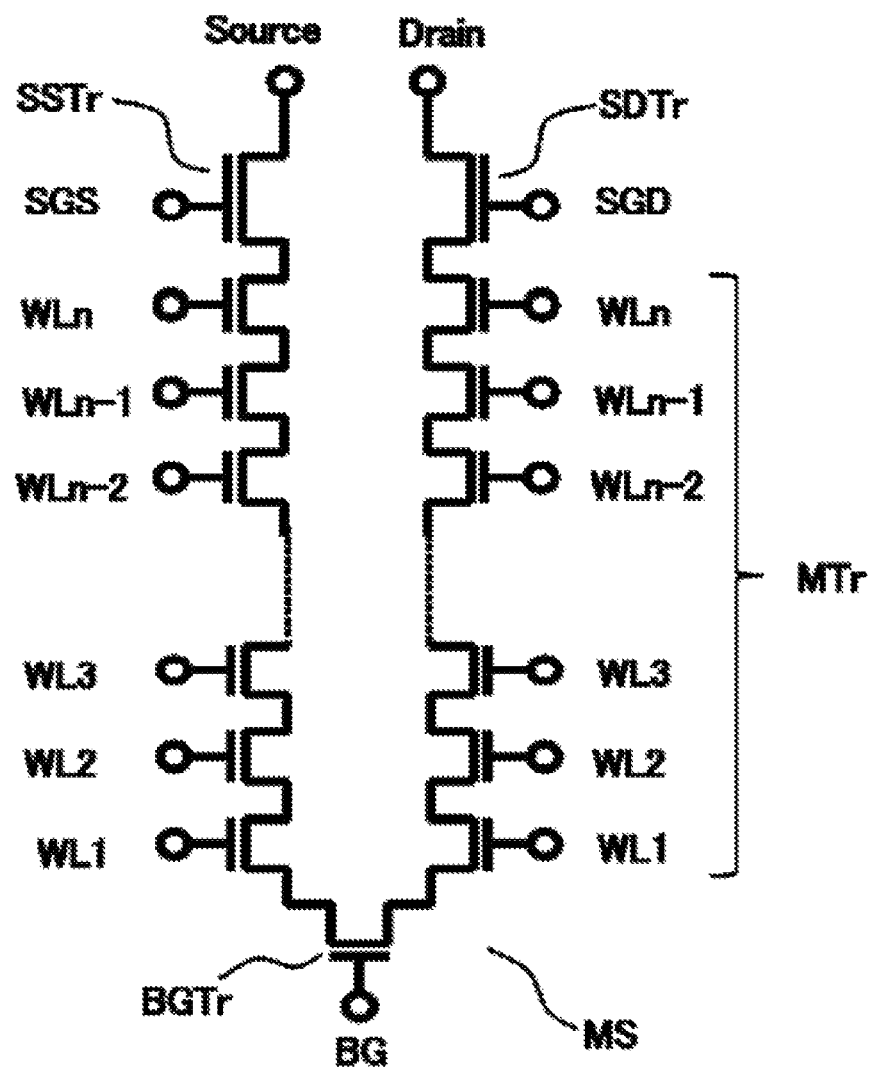
FIG. 3 is an equivalent circuit diagram illustrating memory strings that form a memory cell array.

Referring to FIG. 3, on the memory transistor MTr, the source-side select transistor SSTr or the drain-side select transistor SDTr is arranged.

Referring again to FIG. 2, an insulating film 12 is formed on the interlayer insulating film 7. On the interlayer insulating film 7, as the source-side select transistor SSTr (shown in FIG. 3) or the drain-side select transistor SDTr (shown in FIG. 3), a laminated film of a select gate electrode film 13 and a select gate insulating film 16 is arranged. On the select gate electrode film 13, an insulating film 14 is formed, which bifurcates the select gate electrode film 13. A source-side hole and a drain-side hole going through the laminated film are formed so that the upper surface of the silicon pillar 81 is exposed. In the source-side hole and the drain-side hole, a silicon film 15 is formed within the select gate insulating film 16. The select gate electrodes comprise plate shape extending in a direction parallel with the X-direction, and the select gate electrodes are formed separated and insulated from each other. The insulating films 12 and 14, as well as the select gate insulating film 16 are made of, for example, a silicon oxide film, and the silicon film 15 is made of, for example, polysilicon.

On the upper end of the drain-side silicon film 15, the bit lines BL (shown in FIG. 1) are arranged with the Y-direction as the longitudinal direction. Each bit line BL is connected to a bit line driver that controls application of voltage on the bit line.

On the upper end of the source-side silicon film 15, an n-type diffusion layer (not shown in the drawing) is formed as multiple source lines SL (one is shown in FIG. 1) having the X direction as the longitudinal direction. The source lines SL are connected to the source line driver that controls application of voltage on the source lines. An interlayer insulating film (not shown in the drawing) is arranged between the n-type diffusion layers so that several n-type diffusion layers are insulated and separated from each other. The interlayer insulating film is arranged with the X-direction as the longitudinal direction.

FIG. 3 is an equivalent circuit diagram illustrating the constitution of the memory strings MS that form the memory cell array.

As shown in FIG. 3, the memory transistor MTr is layered in the direction of the word line conductive film 5, and the U-shaped memory strings MS connected in tandem (series) are formed. In the bottom portion of the memory string MS, the back gate selection transistor BGTr is formed. One end of the drain-side select transistor SDTr and one end of the source-side select transistor SSTr are connected to the two ends of the memory string MS, respectively. In addition, the other end of the drain-side select transistor SDTr and the other end of the source-side select transistor SSTr are connected to the bit line BL and the source line SL, respectively. The drain-side select gate line SGD and the source-side select gate line SGS are connected to the gate of the drain-side select transistor SDTr and the gate of the source-side select transistor SSTr, respectively.

In the following, the operation of a deletion method of the nonvolatile semiconductor memory device according to the first embodiment will be explained. In the data deletion operation of the nonvolatile semiconductor memory device according to the first embodiment, data deletion is carried out in block units, each of which include multiple memory strings MS. In the following, the deletion operation will be explained for a selected memory cell block where a memory cell having the deletion object is present.

First of all, a ground voltage VSS is applied on all of the word lines WL, all of the bit lines BL, all of the source lines SL, as well as all of the source-side select gate lines SGS and the drain-side select gate lines SGD.

Then, the back gate line driver has the conduction voltage Vpass applied on the back gate conductive film 3 in the back gate selection transistor BGTr.

In addition, voltages Vera1 to VeraN are applied on the word lines WL1 to WLn arranged sequentially from the bottom layer, respectively. Vera1 to VeraN have levels lower than a voltage provided in a body portion of the memory strings MS to be explained later.

In a conventional nonvolatile semiconductor memory device, the through holes, including a tunnel insulating film, a charge accumulating layer, a block insulating film, and a silicon pillar, are in a tapered shape where the cross-sectional area becomes smaller as each through hole approaches the semiconductor substrate 1. Consequently, as the through hole approaches the semiconductor substrate, the threshold voltage of the memory cell transistor increases. Therefore, when the memory cells on the various layers are deleted en bloc at a constant voltage, some of the memory cells experience an over-deletion state, which degrades the reliability of the nonvolatile semiconductor memory device.

On the other hand, for the nonvolatile semiconductor memory device according to the present embodiment, the voltages Vera1 to VeraN applied on the word lines are different from each other corresponding to the cross-sectional areas of the through holes or the silicon pillars 81 corresponding to the respective word lines. For example, by increasing the voltage applied on the corresponding word line as the cross-sectional area of the through hole decreases, the voltage is applied on the word line conductive film 5 so that the potential of the silicon pillar 81, with respect to the word line conductive film 5, decreases. When the cross-sectional area of the through hole or the silicon pillar 81 becomes smaller as the through hole or the silicon pillar 81 approaches the semiconductor substrate 1, the voltages applied on the word lines are set as follows: Vera1≥Vera2≤ . . . ≥VeraN.

As a result, for the selected memory block, as the voltage applied on the word line is optimized corresponding to the threshold voltage of the memory transistor MTr, it is possible to perform en bloc deletion of the data. Consequently, it is possible to prevent the over-deletion state of the memory cells during the deletion operation to be explained later, and it is possible to suppress degradation of the reliability of the nonvolatile semiconductor memory device according to the first embodiment.

Then, for the drain-side select gate lines, the voltage of SGD0 is increased to about 18 V, as an example. On the other hand, the ground voltage VSS is kept for the source-side select gate lines, for example) in the memory strings MS connected to the non-selected source lines.

Next, a deletion voltage Vera0 (for example, about 20 V) is applied to the selected source line in the selected memory cell block, and the ground voltage VSS is applied to the other source lines just as before the data deletion operation.

The body portion of the memory string MS where the page as the deletion object is located is charged to a prescribed voltage (for example, about 19 V).

In this case, when the voltage applied on the word lines WL1 to WLn is lower than the voltage charged on the body portion of the memory string MS, the electrons are extracted from the charge accumulating film of the memory transistor MTr, and en bloc data deletion is carried out for the memory string MS.

As explained above, according to the first embodiment, the voltages Vera1 to VeraN applied on the word lines are different from each other corresponding to the cross-sectional areas of the through holes or silicon pillars 81 corresponding to the various word lines. As a result, in the selected memory block, corresponding to the threshold voltage of the memory transistor MTr, the voltage applied on the word line is optimized, and en bloc deletion of data can be carried out. Consequently, it is possible to prevent the over-deletion state of the memory cells in the deletion operation to be explained later, and it is possible to suppress degradation in reliability for the nonvolatile semiconductor memory device according to the first embodiment.

(Second Embodiment)

In the following, the nonvolatile semiconductor memory device according to the second embodiment will be explained. The same reference numerals as those in the above in the nonvolatile semiconductor memory device in the first embodiment shown in FIG. 1 are adopted in the constitution of the second embodiment, so they will not be explained in detail again. The second embodiment differs from the first embodiment in that during the deletion operation, the hot holes as the hot carriers are injected to the charge accumulating layer 10 from the body portion of the memory string MS.

In the following, the operation of the deletion method of the nonvolatile semiconductor memory device according to the second embodiment will be explained.

First of all, the ground voltage VSS is applied on all of the word lines WL, all of the bit lines BL, all of the source lines SL, all of the source-side select gate lines SGS and all of the drain-side select gate lines SGD.

Then, the back gate line driver applies the conduction voltage Vpass on the back gate conductive film 3 in the back gate selection transistor BGTr.

Then, in the selected memory cell block, the Vera0 (for example, about 21 V) is applied on the selected source line (SL0), and the ground voltage VSS is applied on the remaining source lines just as in the data deletion operation.

Then, only the source-side select gate line SGS0 is increased to a voltage VeraS. The VeraS is a voltage higher than the Vera0, and it is, for example, about 27 V. As a result, in the memory string MS connected to the source line, a hole current flows as the GIDL (Gate induced Drain Current) current. The GIDL current is a hole current generated near the select gate insulating film 16 of the source-side select transistor SSTr due to the difference between the voltage Vera0 applied on the source line and the voltage VeraS applied on the source-side select gate line.

On the other hand, the ground voltage VSS is kept on the source-side select gate lines in the memory string MS connected to the non-selected source lines. As the voltage on the source lines is ground voltage VSS, no GIDL current flows in the memory strings MS.

Then, voltage VeraN is applied on the word line WLn corresponding to the selected memory transistor MTr(n) where data is to be deleted. The VeraN is, for example, about 13 V. Due to the difference in the potential applied on the source-side select gate line and that applied on the word line WLn, in the body portion of the memory transistor MTr(n), hot holes are generated as the holes hold energy. The hot holes are injected into the charge accumulating layer 10 in the memory transistor MTrn, the threshold voltage of the memory transistor MTr(n) decreases, and data deletion is carried out. As a result, data deletion is performed while the voltage applied on the word line WLn is at a low level. Consequently, it is possible to minimize the power consumption needed for the deletion operation of the nonvolatile semiconductor memory device according to the second embodiment.

Then, a voltage Vpass is applied on the word line WLn corresponding to the memory transistor MTr(n) where the deletion operation ends. The Vpass is a voltage similar to the VeraS, and it is, for example, about 27 V. Then voltage VeraN−1 (≥VeraN) is applied on the word line WLn−1 corresponding to the memory transistor MTr(n−1) for data deletion. In this case, with respect to the potential of the word line WLn−1 corresponding to the memory transistor for data deletion, the potential on the word line WLn adjacent to the upper layer side of the laminate 6 (FIG. 2) increases. As the potential difference between the adjacent word lines increases, the hot holes are generated in the body portion of the memory transistor MTr(n−1) for data deletion. The hot holes are injected into the charge accumulating layer 10 (FIG. 2) in the memory transistor MTr(n−1), the threshold voltage of the memory transistor MTr(n−1) decreases, and data deletion is carried out.

Then, in the same way, the data deletion operation is performed sequentially for the memory transistors. Then, as the final data deletion operation, the voltage Vpass is applied on the word line WL1 corresponding to the memory transistor MTr(2) where the deletion operation ends, and the voltage Vera1 is applied on the word line WL1 corresponding to the memory transistor MTr(1) for data deletion.

The voltages Vera1 to VeraN have a level lower than the voltage charged in the body portion of the memory strings MS to be explained later.

In a conventional nonvolatile semiconductor memory device, the through hole, including a tunnel insulating film, a charge accumulating layer, a block insulating film, and a silicon pillar, has a tapered shape where the cross-sectional area becomes smaller as each through hole approaches the semiconductor substrate. Consequently, as the through hole approaches the semiconductor substrate, the threshold voltage of the memory cell transistor increases. Consequently, when the memory cells on the various layers are deleted en bloc at a constant voltage, some of the memory cells experience an over-deletion state, and the reliability of the nonvolatile semiconductor memory device degrades.

On the other hand, for the nonvolatile semiconductor memory device according to the present embodiment, the voltages Vera1 to VeraN applied on the word lines are different from each other, corresponding to the cross-sectional areas of the through holes or the silicon pillars 81, which correspond to respective word lines. For example, by increasing the voltage applied on the corresponding word line as the cross-sectional area of the through hole becomes smaller, the voltage is applied on the word line conductive film 5 such that the potential on the silicon pillars 81, with respect to the word line conductive film 5, decreases. When the cross-sectional area of the through holes or the silicon pillars 81 becomes smaller as the through hole approaches the semiconductor substrate 1, the voltages applied on the word lines are set as follows: Vera1≥Vera2≥ . . . ≥VeraN.

As a result, in the selected memory block, while the voltage applied on the word line is optimized corresponding to the threshold voltage of the memory transistor MTr, en bloc deletion of data can be carried out. Consequently, it is possible to prevent the over-deletion state of the memory cells during the deletion operation, and it is possible to suppress degradation of the reliability of the nonvolatile semiconductor memory device according to the second embodiment.

In addition, according to the second embodiment, the hot holes generated in the body portion of the memory transistor MTr for data deletion are injected into the charge accumulating layer 10, the threshold voltage of the memory transistor MTr decreases, and the data deletion is carried out. As a result, it is possible to delete data in the state where the voltage applied on the word line WLn is low. Consequently, it is possible to decrease the power consumption needed for the deletion operation of the nonvolatile semiconductor memory device according to the second embodiment.

However, the present embodiment is not limited to the aforementioned embodiments. As long as the gist of the present embodiments are observed, various modifications can be made.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   a laminate including insulating films and conductive films alternately formed above the semiconductor substrate;
   a silicon pillar formed through the laminate to have a tapered cross-section;
   a tunnel insulating film disposed on a surface of the silicon pillar facing the laminate;
   a charge accumulating layer disposed on a surface of the tunnel insulating film facing the laminate; and
   a block insulating film disposed on a surface of the charge accumulating layer facing the laminate and in contact with the conductive film,
   wherein, when a voltage is applied on the conductive film during a data deletion operation for the nonvolatile semiconductor memory device, the potential of the silicon pillar with respect to the conductive film decreases as the cross-sectional area of the silicon pillar becomes smaller.

2. The nonvolatile semiconductor memory device according to claim 1, wherein a plurality of memory transistors are formed through layers of the laminate.

3. The nonvolatile semiconductor memory device according to claim 2, wherein the data deletion operation is carried out sequentially from an upper layer of the laminate.

4. The nonvolatile semiconductor memory device according to claim 3, wherein, when the data deletion operation is carried out for a memory transistor, the potential of the conductive film that is above and adjacent to an upper layer of the memory transistor is increased.

5. The nonvolatile semiconductor memory device according to claim 1, wherein the cross-sectional area of the silicon pillar at the bottommost layer of the laminate is smaller than the cross-sectional area of the silicon pillar at the topmost layer of the laminate.

6. The nonvolatile semiconductor memory device according to claim 1, wherein the silicon pillar has a conical shape.

7. A method of operating a nonvolatile semiconductor memory device having a laminate including insulating films and conductive films alternately formed above the semiconductor substrate, a silicon pillar formed through the laminate, a tunnel insulating film disposed on a surface of the silicon pillar facing the laminate, a charge accumulating layer disposed on a surface of the tunnel insulating film facing the laminate, and a block insulating film disposed on a surface of the charge accumulating layer facing the laminate and in contact with the conductive film, said method comprising:
applying voltages on the conductive films so that the potential of the silicon pillar with respect to the conductive film decreases from upper layers of the laminate towards lower layers of the laminate.

8. The method according to claim 7, wherein a plurality of memory transistors are formed through layers of the laminate and the voltages are applied during a data deletion operation of the memory transistors.

9. The method according to claim 8, wherein the data deletion operation is carried out sequentially from the upper layer of the laminate.

10. The method according to claim 9, wherein, when a data deletion operation is carried out for a memory transistor, the potential of the conductive film that is above and adjacent to an upper layer of the memory transistor is increased.

11. The method according to claim 7, wherein the silicon pillar has a tapered shape.

12. The method according to claim 11, wherein the cross-sectional area of the silicon pillar at the bottommost layer of the laminate is smaller than the cross-sectional area of the silicon pillar at the topmost layer of the laminate.

13. The method according to claim 11, wherein the silicon pillar has a conical shape.

14. A nonvolatile semiconductor memory device comprising:
a semiconductor substrate; and
a plurality of memory transistors formed on the semiconductor substrate, the memory transistors including a laminate including insulating films and conductive films alternately formed above the semiconductor substrate, a silicon pillar formed through the laminate, a tunnel insulating film disposed on a surface of the silicon pillar facing the laminate, a charge accumulating layer disposed on a surface of the tunnel insulating film facing the laminate, and a block insulating film disposed on a surface of the charge accumulating layer facing the laminate and in contact with the conductive film,
wherein, when a voltage is applied on the conductive film during a data deletion operation for the memory transistors, the potential of the silicon pillar with respect to the conductive film decreases as the cross-sectional area of the silicon pillar becomes smaller.

15. The nonvolatile semiconductor memory device according to claim 14, wherein the data deletion operation is carried out sequentially from an uppermost transistor to a lowermost transistor.

16. The nonvolatile semiconductor memory device according to claim 15, wherein, when the data deletion operation is carried out for a memory transistor, the potential of the conductive film that is above and adjacent to an upper layer of the memory transistor is increased.

17. The nonvolatile semiconductor memory device according to claim 14, wherein the silicon pillar has a tapered cross-section.

18. The nonvolatile semiconductor memory device according to claim 17, wherein the cross-sectional area of the silicon pillar at the lowermost layer of the laminate is smaller than the cross-sectional area of the silicon pillar at the uppermost layer of the laminate.

19. The nonvolatile semiconductor memory device according to claim 18, wherein the silicon pillar has a conical shape.

* * * * *